(12) United States Patent
Whetsel

(10) Patent No.: US 8,140,926 B2
(45) Date of Patent: Mar. 20, 2012

(54) DIE SELECTIVELY CONNECTING TAP LEADS TO SECOND DIE

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/246,251

(22) Filed: Sep. 27, 2011

(65) Prior Publication Data

US 2012/0023381 A1 Jan. 26, 2012

Related U.S. Application Data

(62) Division of application No. 12/899,992, filed on Oct. 7, 2010, now Pat. No. 8,055,967, which is a division of application No. 12/642,222, filed on Dec. 18, 2009, now Pat. No. 7,831,878, which is a division of application No. 12/021,582, filed on Jan. 29, 2008, now Pat. No. 7,661,049, which is a division of application No. 10/928,239, filed on Aug. 27, 2004, now Pat. No. 7,346,821.

(60) Provisional application No. 60/498,636, filed on Aug. 28, 2003.

(51) Int. Cl.
 *G01R 31/28* (2006.01)
(52) U.S. Cl. .................. 714/733; 714/727; 714/729
(58) Field of Classification Search .................. 714/726, 714/727, 729, 733
 See application file for complete search history.

(56) References Cited

U.S. PATENT DOCUMENTS

| 6,073,254 | A | * | 6/2000 | Whetsel | 714/30 |
| 6,324,662 | B1 | * | 11/2001 | Haroun et al. | 714/724 |
| 6,334,198 | B1 | * | 12/2001 | Adusumilli et al. | 714/727 |
| 6,378,090 | B1 | * | 4/2002 | Bhattacharya | 714/724 |
| 6,804,725 | B1 | * | 10/2004 | Whetsel | 710/5 |
| 6,934,898 | B1 | * | 8/2005 | Goff | 714/727 |

OTHER PUBLICATIONS

Bhattacharya, D.;, "Hierarchical test access architecture for embedded cores in an integrated circuit," VLSI Test Symposium, 1998. Proceedings. 16th IEEE, vol., No., pp. 8-14, Apr. 26-30, 1998.*
Andrews, J.;, "Roadmap for extending IEEE 1149.1 for hierarchical control of locally-stored, standardized command set, test programs," Test Conference, 1994. Proceedings., International, vol., No., pp. 300-306, Oct. 2-6, 1994.*
Mitra, S.; McCluskey, E.J.; Makar, S.;, "Design for testability and testing of IEEE 1149.1 TAP controller," VLSI Test Symposium, 2002. (VTS 2002). Proceedings 20th IEEE, vol., No., pp. 247-252, 2002.*

* cited by examiner

*Primary Examiner* — Cynthia Britt
(74) *Attorney, Agent, or Firm* — Lawrence J. Bassuk; W. James Brady; Frederick J. Telecky, Jr.

(57) ABSTRACT

An IC includes an IEEE 1149.1 standard test access port (TAP) interface and an additional Off-Chip TAP interface. The Off-Chip TAP interface connects to the TAP of another IC. The Off Chip TAP interface can be selected by a TAP Linking Module on the IC.

2 Claims, 16 Drawing Sheets

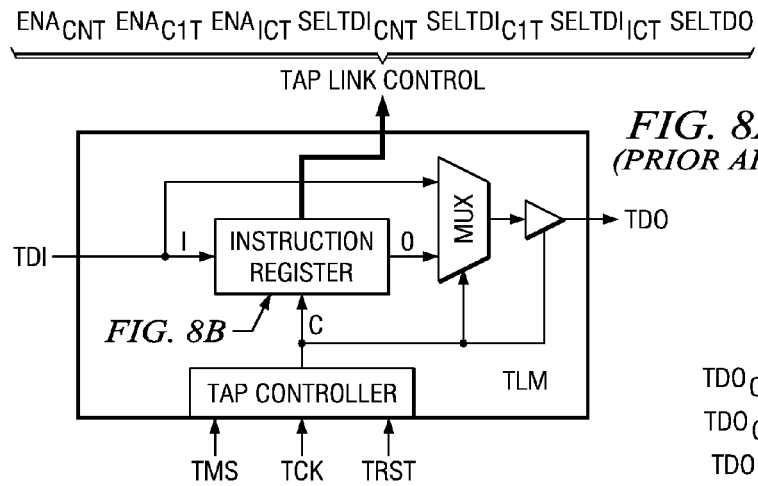
*FIG. 8A*
*(PRIOR ART)*
*FIG. 8B*
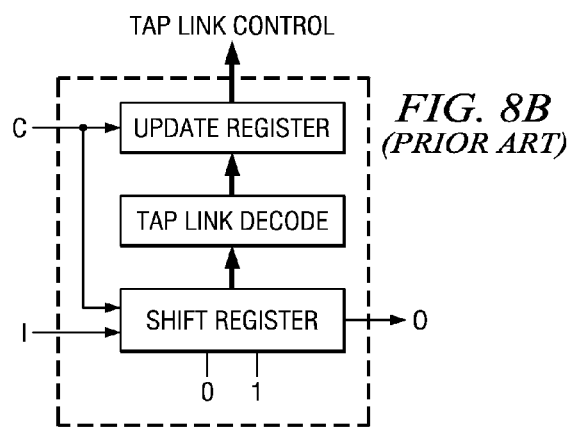
*FIG. 8B*
*(PRIOR ART)*
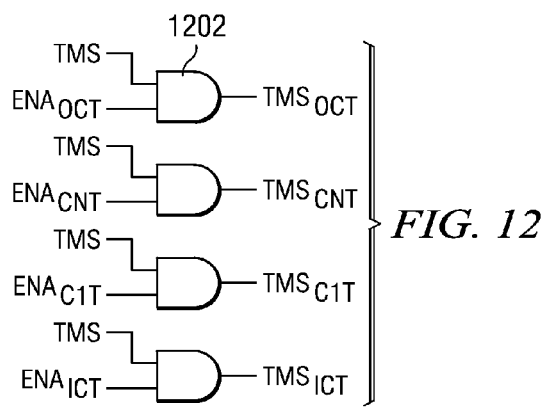
*FIG. 12*
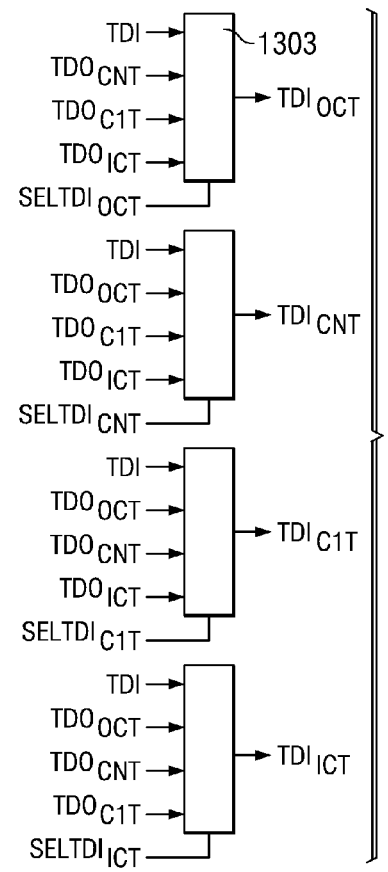
*FIG. 13*
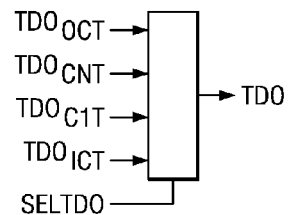
*FIG. 14*

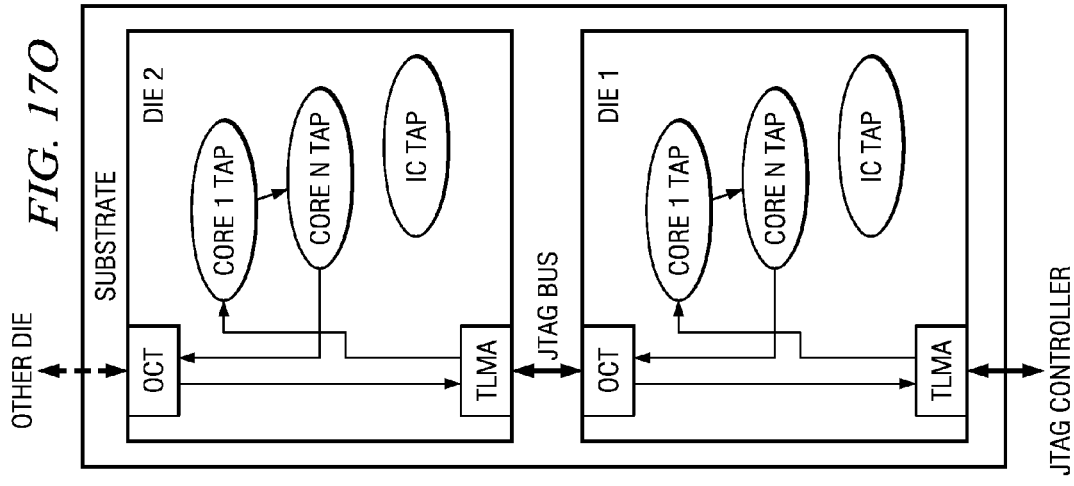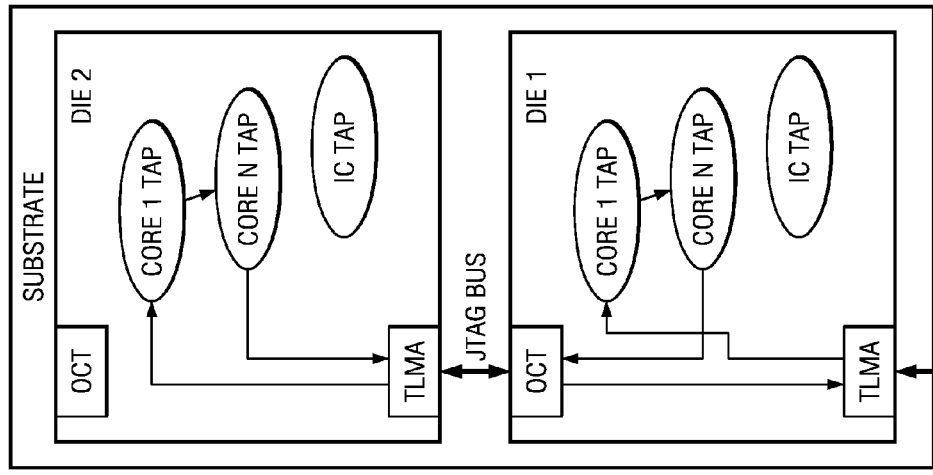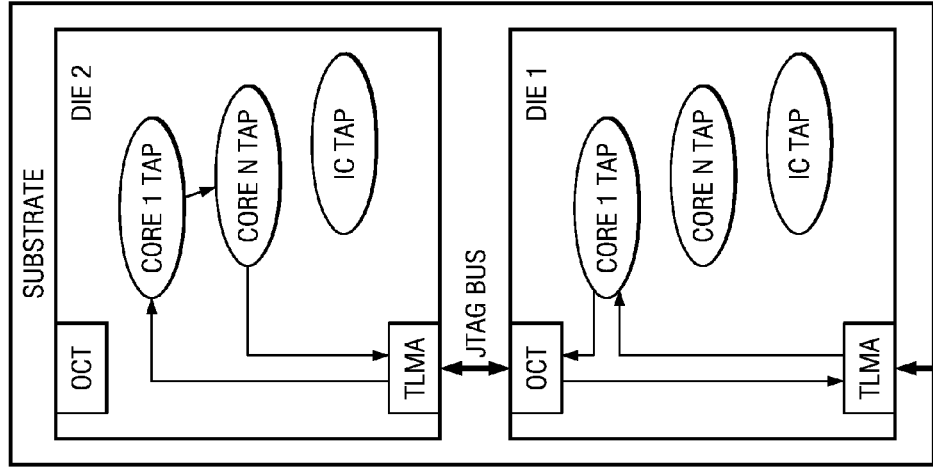

DIE SELECTIVELY CONNECTING TAP LEADS TO SECOND DIE

RELATED PATENTS/APPLICATIONS

This application is a divisional of application Ser. No. 12/899,992, filed Oct. 7, 2010, now U.S. Pat. No. 8,055,967, issued Nov. 8, 2011;
Which was a divisional of application Ser. No. 12/642,222, filed Dec. 18, 2009, Now U.S. Pat. No. 7,831,878, granted Nov. 9, 2010;
Which was a divisional of application Ser. No. 12/021,582, filed Jan. 29, 2008, now U.S. Pat. No. 7,661,049, granted Feb. 9, 2010;
Which was a divisional of application Ser. No. 10/928,239, filed Aug. 27, 2004, now U.S. Pat. No. 7,346,821, granted Mar. 18, 2008;
Which claims priority under 35 USC 119(e)(1) of provisional application No. 60/498,636, filed Aug. 28, 2003.

This application is related to U.S. Pat. Nos. 6,073,254, 6,324,662 and 7,058,862, as well as Patent Publication 2002/0,049,928, all of which are completely incorporated herein by reference.

TECHNICAL FIELD OF THE INVENTION

This invention relates in general to integrated circuits that include an IEEE 1149.1 standard test access port (TAP) interface for providing access to on chip test, debug, emulation, and in-system programming operations. In particular this invention relates to including an additional Off Chip TAP interface. The additional Off Chip TAP interface is used for accessing the JTAG port of another IC that is not externally connected.

BACKGROUND OF THE INVENTION

FIG. 1A illustrates the architecture of a conventional 1149.1 TAP circuit domain. The TAP domain includes a TAP controller, instruction register, set of data register including; (1) an internal scan register, (2) an in-circuit emulation (ICE) register, (3) an in-system programming (ISP) register, (4) a boundary scan register, and (5) a bypass register. Of the data registers, the boundary scan register and bypass register are defined by the IEEE 1149.1 standard. The other shown data registers are not defined by 1149.1, but can exist as data registers within the TAP domain. The TAP controller responds to the Test Clock (TCK) and Test Mode Select (TMS) signal inputs to coordinate serial communication through either the instruction register from Test Data In (TDI) signal to Test Data Out (TDO) signal, or through a selected one of the data registers from TDI to TDO. The Test Reset (TRST) signal input is used to initialize the TAP domain to a known state. The operation of the TAP domain is well known FIG. 1B illustrates an IC or intellectual property core circuit incorporating the TAP domain and its TDI, TDO, TMS, TCK, and TRST interface. A core is a complete circuit function that is embedded within the substrate of an IC, such as a DSP or CPU core.

FIGS. 1C-1F illustrate the association between each of the data registers of FIG. 1A and the functional target circuit they connect to and access.

FIG. 2 illustrates the state diagram of the TAP controller of FIG. 1A. The TAP controller is clocked by the TCK input and transitions through the states of FIG. 2 in response to the TMS input. As seen in FIG. 2, the TAP controller state diagram consists of four key state operations, (1) a Reset/RunTest Idle state operation where the TAP controller goes to either enter a reset state, a run test state, or an idle state, (2) a Data or Instruction Scan Select state operation the TAP controller may transition through to select a data register (DR) or instruction register (IR) scan operation, or return to the reset state, (3) a Data Register Scan Protocol state operation where the TAP controller goes when it communicates to a selected data register, and (4) an Instruction Register Scan Protocol state operation where the TAP controller goes when it communicates to the instruction register. The operation of the TAP controller is well known.

FIG. 3 illustrates an example arrangement for connecting multiple TAP domains within an IC. Each TAP domain in FIG. 3 is similar to that shown and described in regard to FIG. 1A. While only one IC TAP domain exists in an IC, any number of core TAP domains (1-N) may exist within an IC. As seen in FIG. 3, the IC TAP domain and Core 1-N TAP domains are daisychained between the IC's TDI and TDO pins. All TAP domains are connected to the IC's TMS, TCK, and TRST signals and operate according to the state diagram of FIG. 2. During instruction scan operations, instructions are shifted into each TAP domain instruction register. One drawback of the TAP domain arrangement of FIG. 3 is that it does not comply with the IEEE 1149.1 standard, since, according to the rules of that standard, only the ICs TAP domain should be present between TDI and TDO when the IC is initially powered up. A second drawback of the TAP domain arrangement of FIG. 3 is that it may lead to unnecessarily complex access for testing, in-circuit emulation, and/or in-circuit programming functions associated with ones of the individual TAP domains.

For example, if scan testing is required on circuitry associated with the Core 1 TAP domain, each of the scan frames of the test pattern set developed for testing the Core 1 circuitry must be modified from their original form. The modification involves adding leading and trailing bit fields to each scan frame such that the instruction and data registers of the leading and trailing TAP domains become an integral part of the test pattern set of Core 1. Serial patterns developed for in-circuit emulation and/or in-circuit programming of circuitry associated with the TAP domain of Core 1 must be similarly modified. To overcome these and other drawbacks of the TAP arrangement of FIG. 3, the TAP arrangement of FIG. 4 was developed.

FIG. 4 illustrates a preferred structure for connecting multiple TAP domains within an IC according to U.S. Pat. No. 7,058,862. The structure includes input and output linking circuitry for connecting any one or more TAP domains to the IC's TDI, TDO, TMS, TCK and TRST pins or bond pads, and a TAP Linking Module (TLM) circuit for providing the control to operate the input and output linking circuitry. The combination of the input and output linking circuitry and TLM are hereafter referred to as the TLM architecture (TLMA). The concept of input and output linking circuitry and use of a TLM circuit to control the input and output linking circuitry was first disclosed in the referenced U.S. Pat. No. 7,058,862. The concept of the use of a TLM circuit was first disclosed in the referenced U.S. Pat. No. 6,073,254.

The input linking circuitry receives as input; (1) the TDI, TMS, TCK, and TRST signals on pins or bond pads of the IC, (2) the TDO outputs from the IC TAP (ICT) domain ($TDO_{ICT}$), the Core 1 TAP (C1T) domain ($TDO_{C1T}$), and the Core N TAP (CNT) domain ($TDO_{CNT}$), and (3) TAP link control input from the TLM. The TCK and TRST inputs pass unopposed through the input linking circuitry to be input to each TAP domain. The TMS input to the input linking circuitry is gated within the input linking circuitry such that each TAP domain receives a uniquely gated TMS output signal. As seen in FIG. 4, the IC TAP domain receives a gated $TMS_{ICT}$ signal, the Core 1 TAP domain receives a gated $TMS_{C1T}$ signal, and the Core N TAP domain receives a gated $TMS_{CNT}$ signal. Example circuitry for providing the gated $TMS_{ICT}$, $TMS_{C1T}$, and $TMS_{CNT}$ signals is shown in FIG. 5. In FIG. 5, the $ENA_{ICT}$, $ENA_{C1T}$, and $ENA_{CNT}$ signals used to gate the $TMS_{ICT}$, $TMS_{C1T}$, and $TMS_{CNT}$ signals, respectively, come from the TLM via the TAP link control bus.

From FIG. 5 it is seen that $TMS_{CNT}$ can be connected to TMS to enable the Core N TAP domain or be gated low to disable the Core N TAP domain, $TMS_{C1T}$ can be connected to TMS to enable the Core 1 TAP domain or be gated low to disable the Core 1 TAP domain, and $TMS_{ICT}$ can be connected to TMS to enable the IC TAP domain or be gated low to disable the IC TAP domain. When a TAP domain TMS input ($TMS_{CNT}$, $TMS_{C1T}$, $TMS_{ICT}$) is gated low, the TAP domain is disabled by forcing it to enter the Run Test/Idle state of FIG. 2. A disabled TAP domain will remain in the Run Test/Idle state until it is again enabled by coupling it to the IC's TMS pin input as mentioned above. These methods of enabling TAP domains from the Run Test/Idle state and disabling TAP domains to the Run Test/Idle state was first disclosed in referenced U.S. Pat. No. 6,073,254.

The TDI, $TDO_{CNT}$, $TDO_{C1T}$ and $TDO_{ICT}$ inputs to the input linking circuitry are multiplexed by circuitry within the input linking circuitry such that each TAP domain receives a uniquely selected TDI input signal. As seen in FIG. 4, the IC TAP domain receives a $TDI_{ICT}$ input signal, the Core 1 TAP domain receives a $TDI_{C1T}$ input signal, and the Core N TAP domain receives a $TDI_{CNT}$ input signal. Example circuitry for providing the $TDI_{ICT}$, $TDI_{C1T}$, and $TDI_{CNT}$ input signals is shown in FIG. 6.

In FIG. 6, the $SELTDI_{ICT}$, $SELTDI_{C1T}$, and $SELTDI_{CNT}$ control signals used to select the source of the $TDI_{ICT}$, $TDI_{C1T}$, and $TDI_{CNT}$ input signals, respectively, come from the TLM via the TAP link control bus. From FIG. 6 it is seen that $TDI_{CNT}$ can be selectively connected to TDI, $TDO_{C1T}$, or $TDO_{ICT}$, $TDI_{C1T}$ can be selectively connected to TDI, $TDO_{CNT}$, or $TDO_{ICT}$, and $TDI_{ICT}$ can be selectively connected to TDI, $TDO_{CNT}$, or $TDO_{C1T}$.

The output linking circuitry receives as input; (1) the $TDO_{CNT}$ output from the Core N TAP domain, the $TDO_{C1T}$ output from the Core 1 TAP domain, the $TDO_{ICT}$ output from the IC TAP domain, and TAP link control input from the TLM. As seen in FIG. 4, the output linking circuitry outputs a selected one of the $TDO_{CNT}$, $TDO_{C1T}$, and $TDO_{ICT}$ input signals to the TLM via the output linking circuitry TDO output. Example circuitry for providing the multiplexing of the $TDO_{ICT}$, $TDO_{C1T}$, and $TDO_{CNT}$ signals to the TDO output is shown in FIG. 7.

In FIG. 7, the SELTDO control input used to switch the $TDO_{ICT}$, $TDO_{C1T}$, or $TDO_{CNT}$ signals to TDO come from the TLM via the TAP link control bus. From FIG. 7 it is seen that any one of the $TDO_{CNT}$, $TDO_{C1T}$, and $TDO_{ICT}$ signals can be selected as the input source to the TLM.

The TLM circuit receives as input the TDO output from the output linking circuitry and the TMS, TCK, and TRST IC input pin signals. The TLM circuit outputs to the IC's TDO output pin. From inspection, it is seen that the TLM lies in series with the one or more TAP domains selected by the input and output linking circuitry.

As described above, the TLM's TAP link control bus is used to control the input and output connection circuitry to form desired connections to one or more TAP domains so that the one of more TAP domains may be accessed via the IC's TDI, TDO, TMS, TCK, and TRST pins. The TAP link control bus signals are output from the TLM during the Update-IR state of the IEEE TAP controller state diagram of FIG. 2.

FIG. 8A illustrates in detail the structure of the TLM. The TLM consists of a TAP controller, instruction register, multiplexer, and 3-state TDO output buffer. The TAP controller is connected to the TMS, TCK and TRST signals. The TDI input is connected to the serial input (I) of the instruction register and to a first input of the multiplexer. The serial output (O) of the instruction register is connected to the second input of the multiplexer. The parallel output of the instruction register is connected to the TAP link control bus of FIG. 4. The output of the multiplexer is connected to the input of the 3-state buffer. The output of the 3-state buffer is connected to the IC TDO output pin. The TAP controller outputs control (C) to the instruction register, multiplexer, and 3-state TDO output buffer. The TAP controller responds to TMS and TCK input as previously described in regard to FIGS. 1A and 2. During instruction scan operations, the TAP controller enables the 3-state TDO buffer and shifts data through the instruction register from TDI to TDO. During data scan operations, the TAP controller enables the 3-state TDO buffer and forms a connection, via the multiplexer, between TDI and TDO.

FIG. 8B illustrates the instruction register in more detail. The instruction register consists of a shift register, TAP link decode logic, and update register. The shift register has a serial input (I), a serial output (O), a control (C) inputs, a parallel output, and a parallel input. The parallel input is provided for capturing fixed logic 0 and 1 data bits into the first two bit positions shifted out on TDO during instruction scan operations, which is a requirement of the IEEE 1149.1 standard. The parallel output from the instruction register is input to TAP link decode logic. The parallel output from the TAP link decode logic is input to the update register. The parallel output of the update register is the TAP link control bus input to the input and output linking circuitry. During the Capture-IR state of FIG. 2, the shift register captures data (0 & 1) on the parallel input, During the Shift-IR state of FIG. 2, the shift register shifts data from TDI (I) to TDO (O). During the Update-IR state of FIG. 2, the update register loads the parallel input from the TAP link decode logic and outputs the loaded data onto the TAP link control bus.

FIG. 9 illustrates various possible link arrangements Link0-Link6 of TAP domain connections during 1149.1 instruction scan operations using the TLMA. Since during instruction scan operations, the TLM's instruction register is physically present and in series with the connected TAP domain(s) instruction register(s), the instruction scan frame for each link arrangement will be augmented to include the TLM's instruction register bits. The concept of augmenting the length of TAP domain instruction registers with a TLM's instruction register was first disclosed in referenced pending patent application TI-27596. In this example, the TLM's instruction shift register of FIG. 8B is 3 bits long and the 3 bit instructions (000-110) are decoded by the TAP link decode logic of FIG. 8B to uniquely select a different TAP domain connection link arrangement between the ICs TDI and TDO pins. Shifting in the following 3 bit TLM instructions and updating them from the TLM to be input to the input and output linking circuitry will cause the following TAP domain link connections to be formed.

A Link0 "000" instruction shifted into and updated from the TLM instruction register will cause the IC TAP domain to be enabled and connected in series with the TLM between the TDI and TDO IC pins.

A Link1 "001" instruction shifted into and updated from the TLM instruction register will cause the IC TAP domain and the Core 1 TAP Domain to be enabled and connected in series with the TLM between the TDI and TDO IC pins.

A Link2 "010" instruction shifted into and updated from the TLM instruction register will cause the IC TAP domain and the Core N TAP Domain to be enabled and connected in series with the TLM between the TDI and TDO IC pins.

A Link3 "011" instruction shifted into and updated from the TLM instruction register will cause the IC TAP domain, the Core 1 TAP Domain, and the Core N TAP domain to be enabled and connected in series with the TLM between the TDI and TDO IC pins.

A Link4 "100" instruction shifted into and updated from the TLM instruction register will cause the Core 1 TAP Domain to be enabled and connected in series with the TLM between the TDI and TDO IC pins.

A Link5 "101" instruction shifted into and updated from the TLM instruction register will cause the Core 1 TAP Domain and Core N TAP domain to be enabled and connected in series with the TLM between the TDI and TDO IC pins.

A Link6 "110" instruction shifted into and updated from the TLM instruction register will cause the Core N TAP Domain to be enabled and connected in series with the TLM between the TDI and TDO IC pins.

At power up of the IC, the TLM 3-bit instruction shall be initialized to "000" to allow the IC TAP domain Link0 arrangement to be enabled and coupled between TDI and TDO. This complies with the IC power up requirement established in the IEEE 1149.1 standard. The process of powering up a multiple TAP domain IC to where only the IC TAP domain is enabled and selected between the IC's TDI and TDO pins was first disclosed in referenced patent application TI-23727. Following power up, an instruction scan operation can be performed to shift instruction data through the IC TAP domain and the serially connected TLM to load a new IC TAP domain instruction and to load a new 3 bit link instruction into the TLM. If the power up IC TAP domain Link0 arrangement is to remain in effect between TDI and TDO, the 3 bit "000" TLM instruction of FIG. 9 will be re-loaded into the TLM instruction register during the above mentioned instruction scan operation. However, if a new TAP domain link arrangement is desired between TDI and TDO, a different 3 bit TLM link instruction will be loaded into the TLM instruction register during the above mentioned instruction register scan operation.

FIG. 10 is provided to illustrate that during 1149.1 data scan operations the TLM is configured, as described in regard to FIG. 8A, to simply form a connection path between the output of the selected TAP domain link arrangement Link0-Link6 and the IC's TDO pin. Thus the TLM does not add bits to 1149.1 data scan operations as it does for 1149.1 instruction scan operations.

SUMMARY OF THE INVENTION

In accordance with the present invention, the TLM architecture provides an Off-Chip TAP interface to external the IC that can be selected in a link arrangement. The Off-Chip TAP interface can be used to select the IEEE 1149.1 TAP interface of another, separate IC to be included in a link arrangement. The improvement therefore provides for the TLM architecture of an IC to be used not only for selecting TAP domains residing in the IC but also used for selecting TAP domains residing on other ICs. For example, the TAP domain of an external IC/die may be selected.

The other, separate IC included in the link arrangement from the Off-Chip TAP interface may include its own TLM architecture. The other, separate IC included in the link arrangement from the Off-Chip TAP interface may further include its own Off-Chip TAP interface to the IEEE 1149.1 TAP interface of further ICs. This provides for a hierarchy arrangement of TAP interfaces.

Any number of Off-Chip TAP interfaces may be provided on one IC.

BRIEF DESCRIPTION OF THE DRAWINGS

FIG. 8A illustrates conventional art TLM circuitry that could be used in the FIG. 4 TLM architecture.

FIG. 8B illustrates an instruction register that could be used in the conventional art TLM circuitry of FIG. 8A.

FIG. 12 illustrates the TMS gating circuitry of FIG. 5 including an additional TMS gate for controlling access to the OCT interface.

FIG. 13 illustrates the TDI multiplexing circuitry of FIG. 6 including an additional TDI multiplexer for input to OCT interface and the other multiplexers being equipped with an additional input for receiving TDO input from the OCT interface.

FIG. 14 illustrates the TDO multiplexer circuitry of FIG. 7 being equipped with an additional input for receiving the TDO output from the OCT interface.

DETAILED DESCRIPTION OF THE INVENTION

Figure 4:
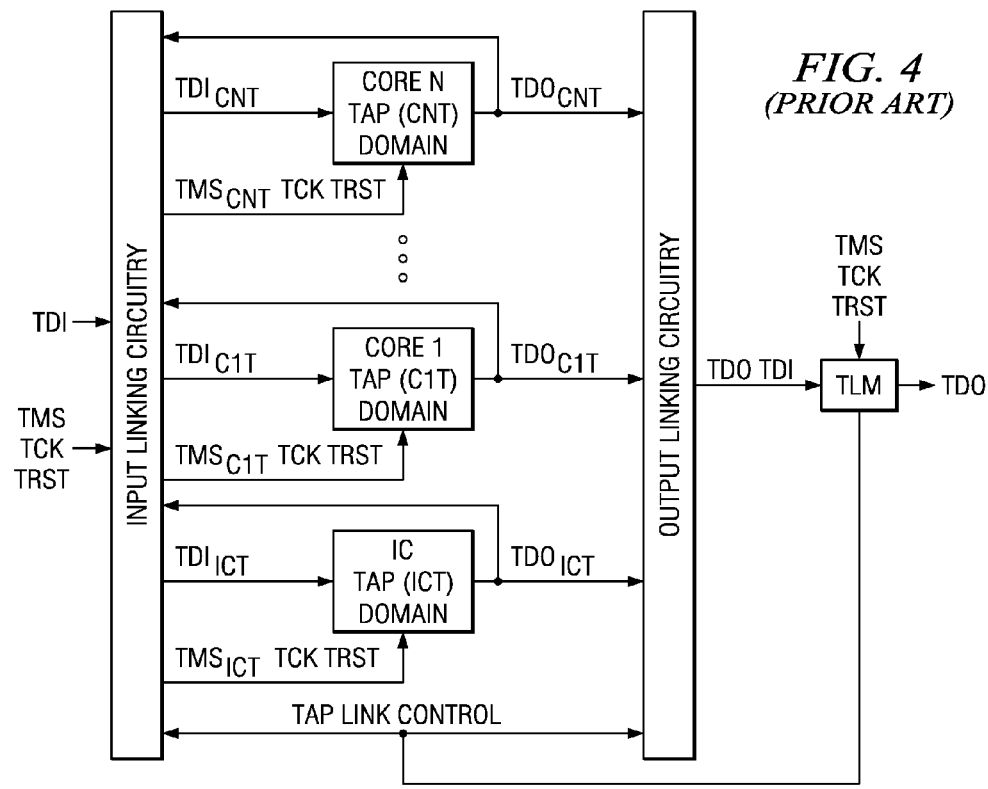
FIG. 4 illustrates a conventional art TAP Linking Module (TLM) Architecture implemented within an IC.
Figure 11A:
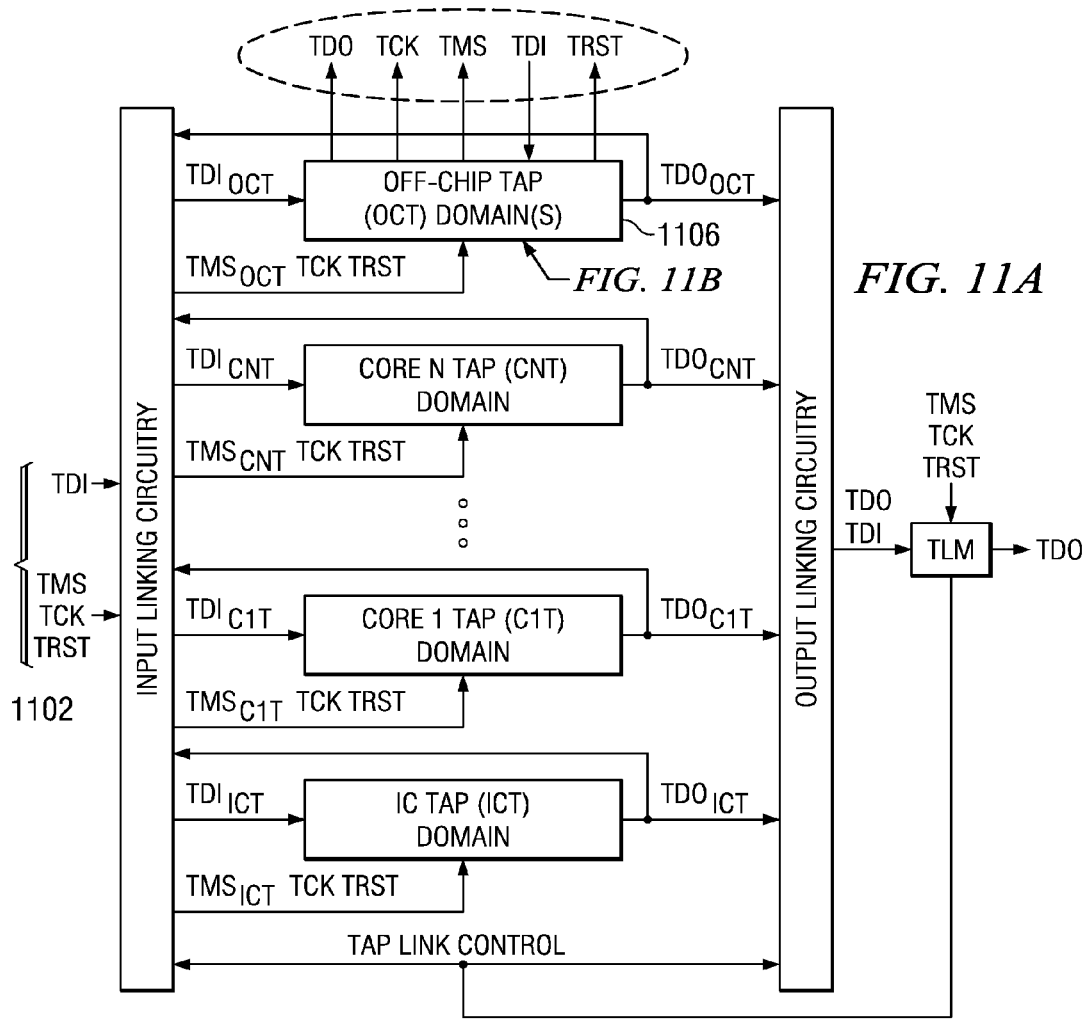
FIG. 11A illustrates the TLM architecture of FIG. 4 improved to include the Off-Chip TAP (OCT) interface of the present invention.

FIG. 11A illustrates the improvement to the TLM architecture of FIG. 4. The improvement is the addition of an Off-Chip Tap (OCT) interface 1106. The OCT interface can be selected between the ICs TDI and TDO pins, via the TLM's TAP Link Control bus, exactly as the IC and core TAP domains were described being selected. Once selected, the OCT interface can serve as a master TAP interface to a slave TAP interface (i.e. a conventional 1149.1 TAP interface) on another IC. Thus an IC having the TLM architecture improvement shown in FIG. 11A would have the conventional 1149.1 TAP interface 1102 plus the selectable OCT interface 1106 for mastering the TAP interface of another IC or ICs 1108. While one OCT interface 1106 is shown in FIG. 11A, any number of OCT interfaces may be provided.

Figure 11B:
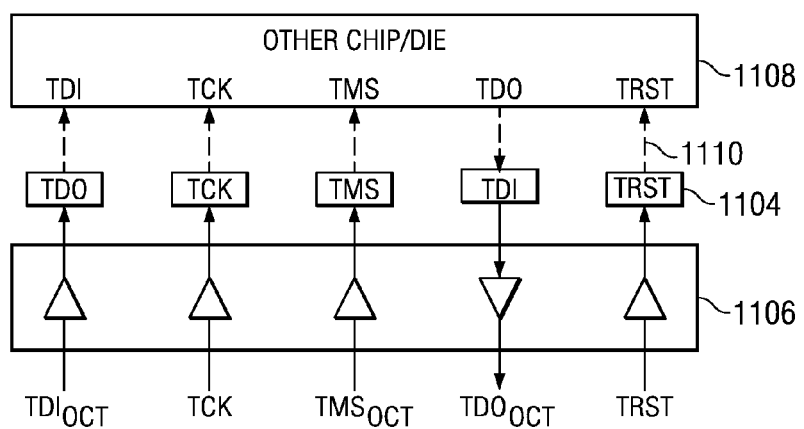
FIG. 11B illustrates the OCT interface being coupled to the JTAG interface of another IC/die.

FIG. 11B illustrates the OCT interface 1106 being coupled 1110 to a TAP interface of another IC 1108. As seen in FIG. 11B, the OCT interface consists of buffers which couple the $TDI_{OCT}$, TCK, $TMS_{OCT}$, $TDO_{OCT}$, and TRST TLM architecture signals up to TDO, TCK, TMS, TDI, and TRST pads 1104, respectively, of the IC in which the TLM architecture resides. The TDO, TCK, TMS, TDI and TRST pads 1104 can be coupled to the TDI, TCK, TMS, TDO and TRST pads of the other IC 1108, via connections 1110, to provide access the TAP domain of the other IC 1108. The TAP domain of the other IC could be similar to that shown in FIG. 1A.

Figure 5:
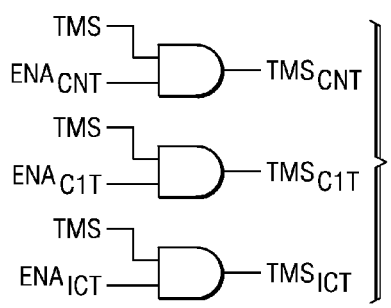
FIG. 5 illustrates conventional art TMS gating circuitry that could be used in the input linking circuitry of the FIG. 4 TLM architecture.
Figure 6:
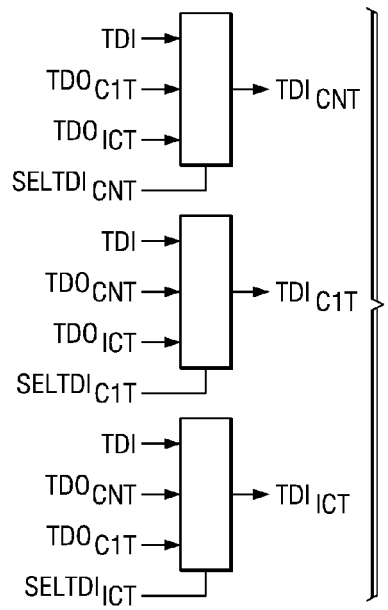
FIG. 6 illustrates conventional art TDI multiplexing circuitry that could be used in the input linking circuitry of the FIG. 4 TLM architecture.
Figure 7:
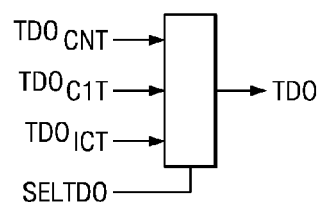
FIG. 7 illustrates conventional art TDO multiplexing circuitry that could be used in the output linking circuitry of the FIG. 4 TLM architecture.

FIGS. 12-14 illustrate the changes required to the Input and Output linking circuitry of FIGS. 5-7, respectively, to add the OCT interface of FIG. 11A. As seen in FIG. 12, an additional AND gate 1202 is added to provide gating on and off the TMS input ($TMS_{OCT}$) of the OCT interface. As seen in FIG. 13, an additional multiplexer 1302 is provided for selecting the TDI input ($TDI_{OCT}$) of the OCT interface, and the other multiplexers are provided with an additional input for receiving the TDO output ($TDO_{OCT}$) of the OCT interface. As seen in FIG. 14, an input is added to the output multiplexer to receive the TDO output ($TDO_{OCT}$) of the OCT. Additionally, control signals are added to the TLM's TAP Link Control bus to provide for controlling the added $TMS_{OCT}$ AND gate, the additional $TDI_{OCT}$ multiplexer, and the additional $TDO_{OCT}$ input to the multiplexers.

Figure 15:
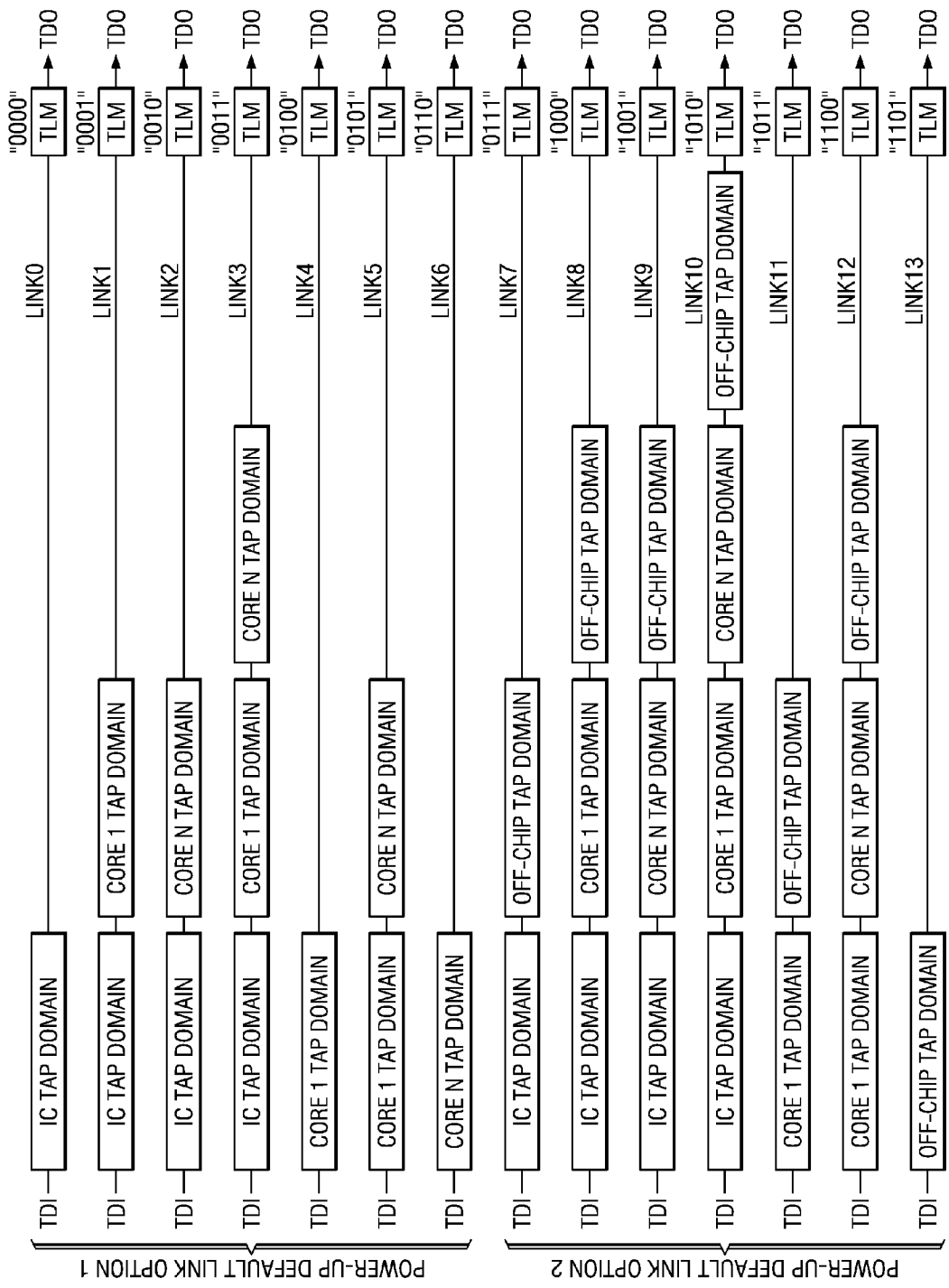
FIG. 15 illustrates some possible TAP domain linking arrangements from the TLM architecture of FIG. 11A as they would appear during JTAG instruction scan operations.

FIG. 15 illustrates examples of the possible TAP Link arrangements (Link0-Link13) of the TLM architecture of FIG. 11A during TAP instruction register scan operations. The link arrangements include those previously shown in FIG. 9, plus additional link arrangements that include the OCT interface. As seen, there are two powerup/reset options for the default TAP link, Link0 and Link7. The Link0 (option 1) selects only the IC's TAP in the link, whereas Link7 (option 2) selects the IC's TAP plus the OCT interface in the link. An example of why option 2 may be necessary is shown in example F of FIG. 17.

Figure 9:
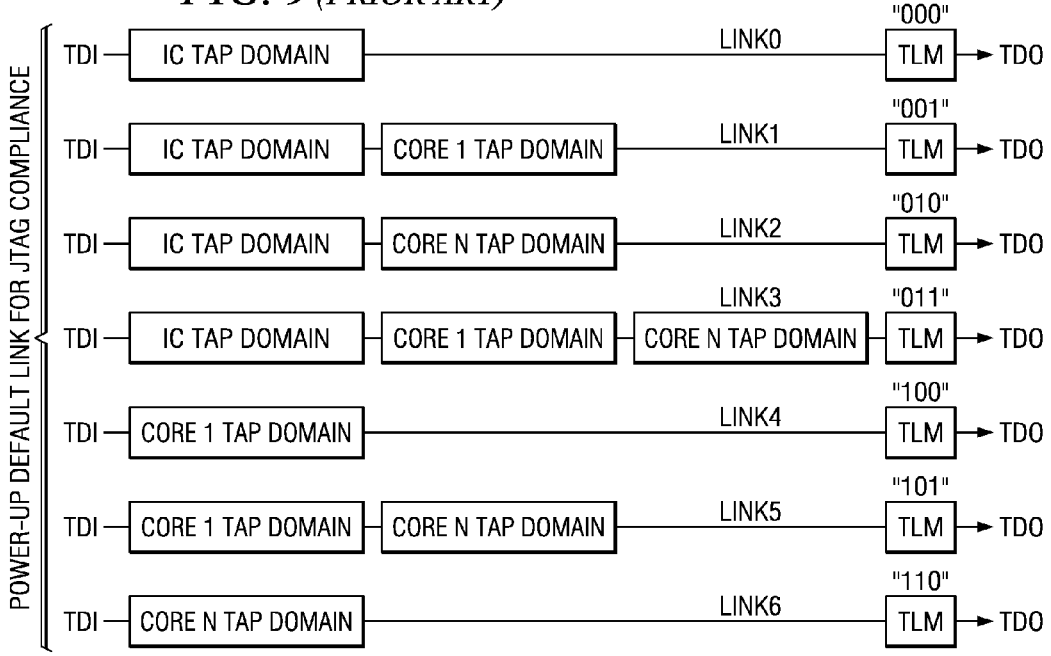
FIG. 9 illustrates some possible conventional art TAP domain linking arrangements of the TLM architecture of FIG. 4 as they would appear during JTAG instruction scan operations.
Figure 10:
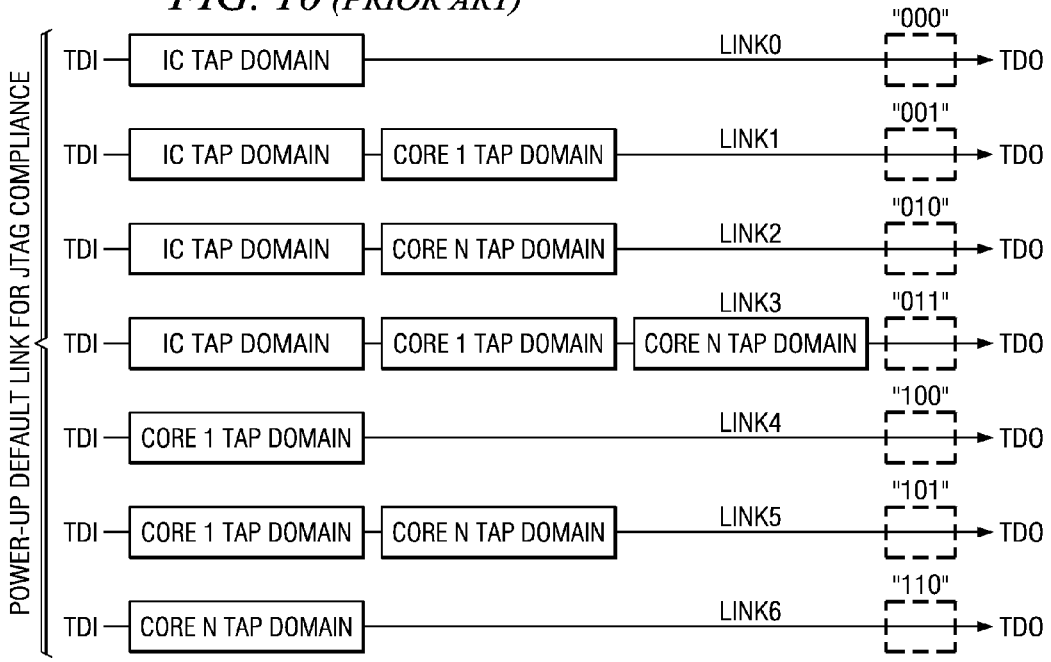
FIG. 10 illustrates the conventional art TAP domain linking arrangements of FIG. 9 as they would appear during JTAG data scan operations.
Figure 16:
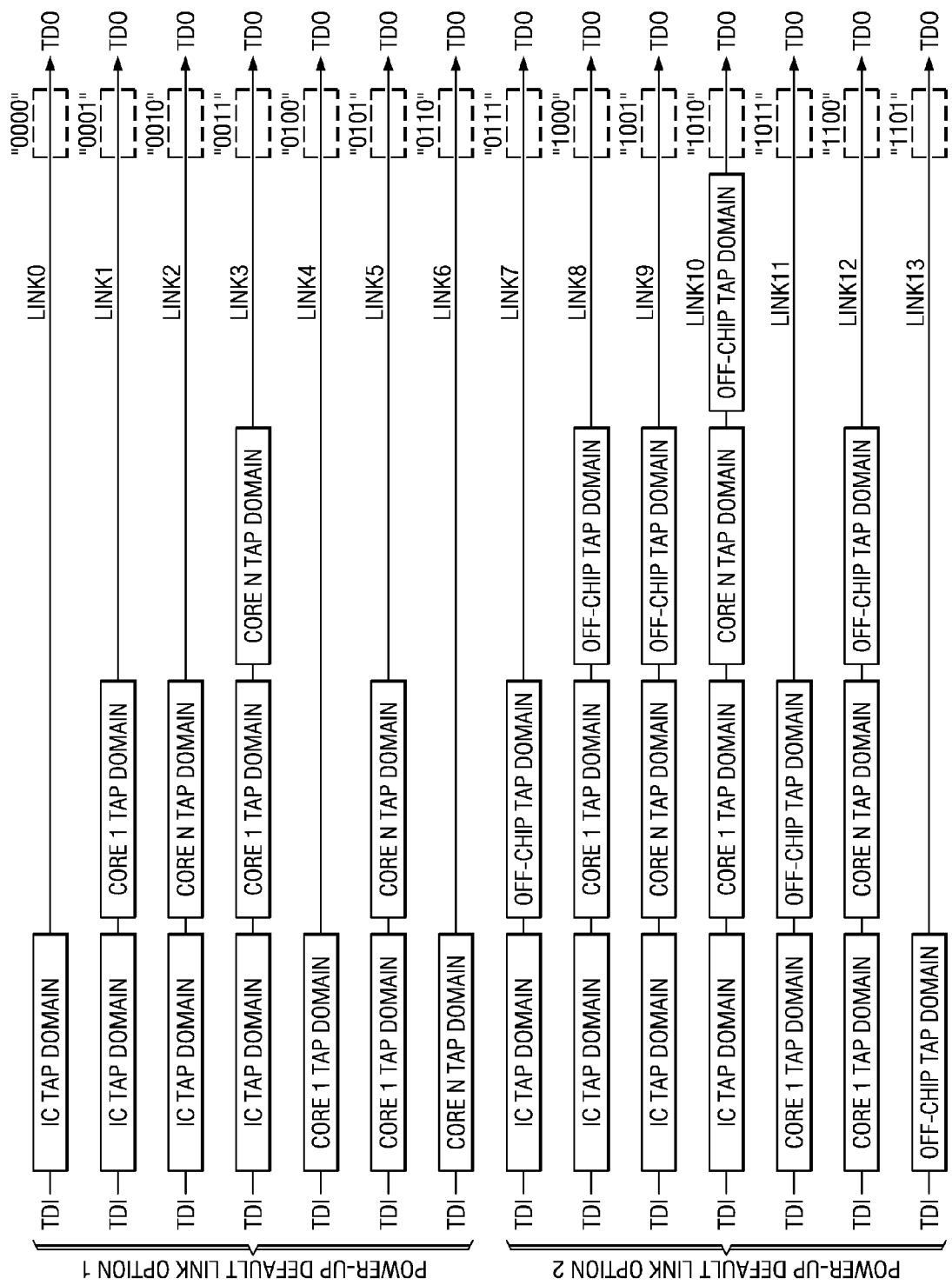
FIG. 16 illustrates the TAP domain linking arrangements of FIG. 14 as they would appear during JTAG data scan operations.

FIG. 16 is provided to simply show, as did FIG. 9, that the TLM is transparent during TAP data register scan operations.

Figure 1A:
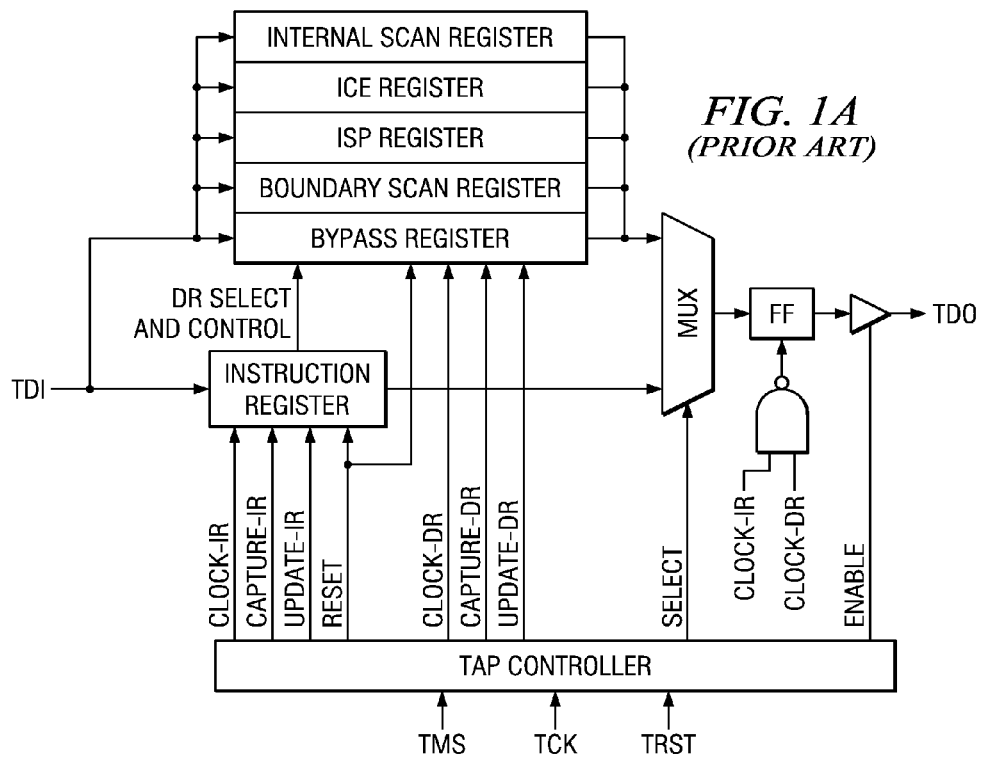
FIG. 1A illustrates a conventional art IEEE 1149.1 (JTAG) architecture as it could be implemented within an IC or core circuit.
Figure 1B:
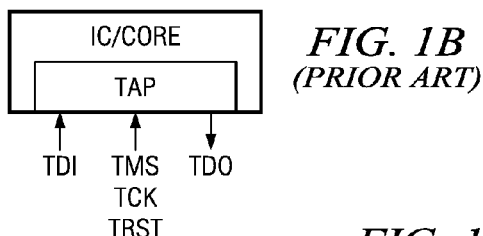
FIG. 1B illustrates the conventional art substrate of an IC or core circuit including the JTAG architecture and interface.
Figure 1C:
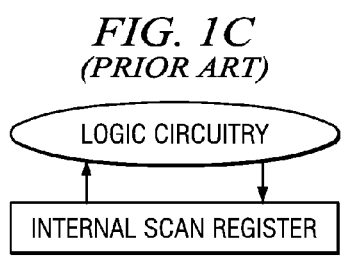
FIG. 1C illustrates a conventional art JTAG accessible internal scan path coupled to logic circuitry.
Figure 1D:
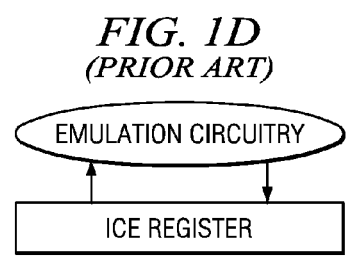
FIG. 1D illustrates a conventional art JTAG accessible in-circuit emulation register coupled to emulation circuitry.
Figure 1E:
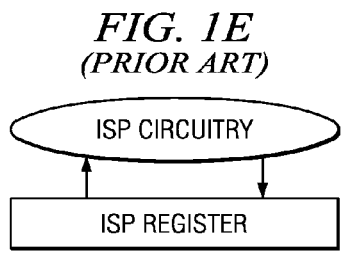
FIG. 1E illustrates a conventional art JTAG accessible in-system programming register coupled to in-system programming circuitry.
Figure 1F:
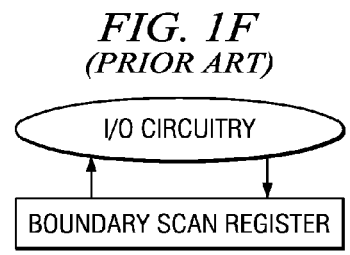
FIG. 1F illustrates a conventional art JTAG accessible boundary scan register coupled to input and output circuitry.
Figure 2:
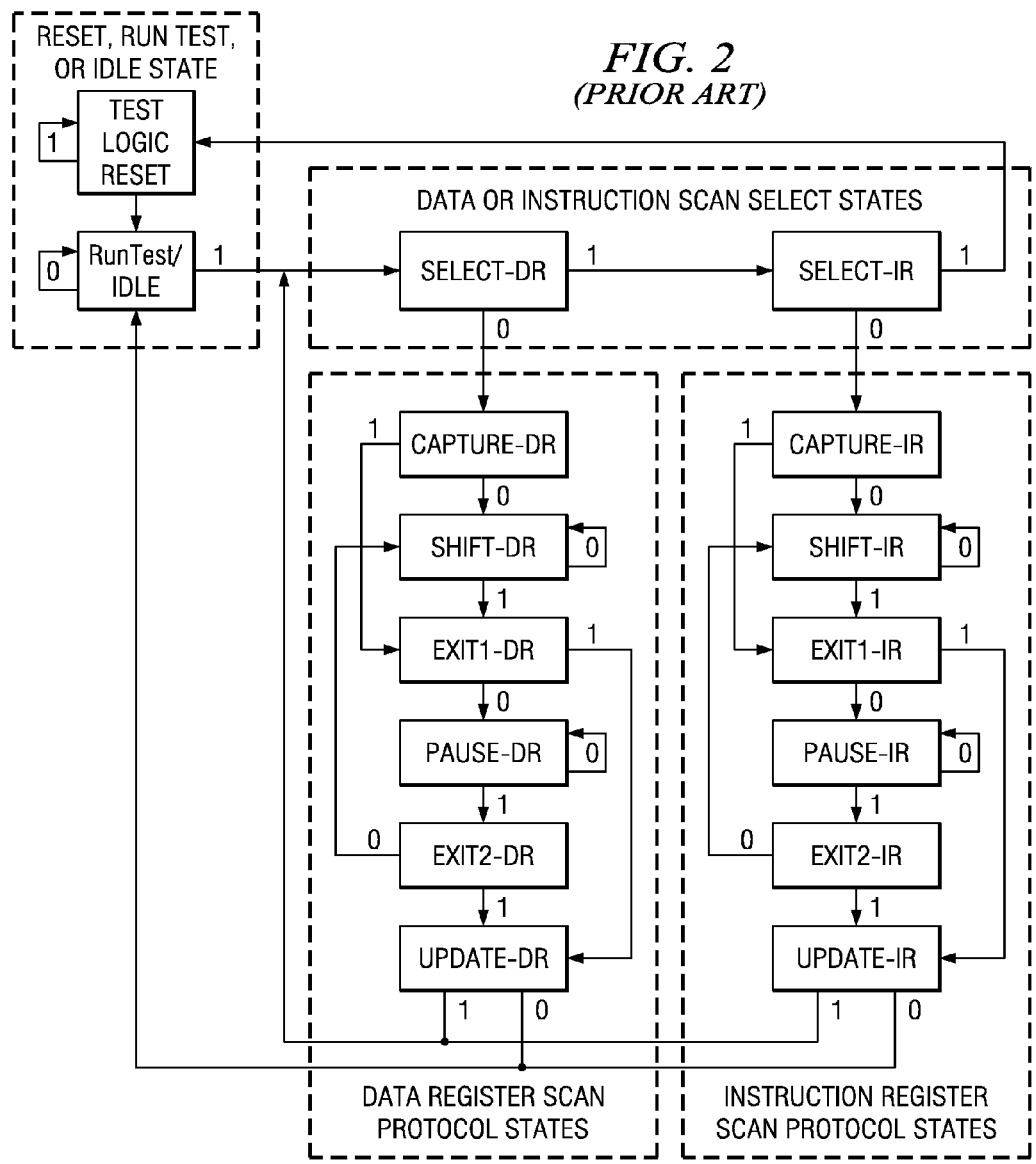
FIG. 2 illustrates the conventional art state diagram of the JTAG TAP controller.
Figure 3:
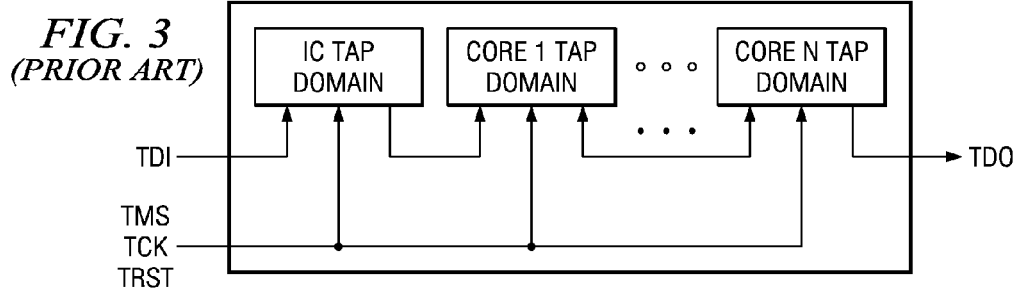
FIG. 3 illustrates an IC containing conventional art TAP domains daisy-chained between the ICs TDI and TDO pins.
Figure 17A:
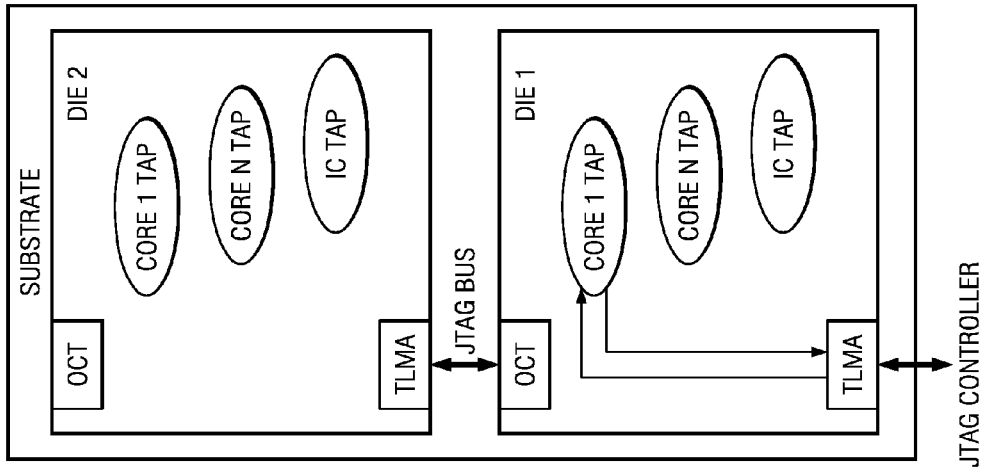
FIGS. 17A-17O illustrate various TAP domain link arrangements between two Die on a substrate, each Die including the improved TLM architecture of FIG. 11A.
Figure 17B:
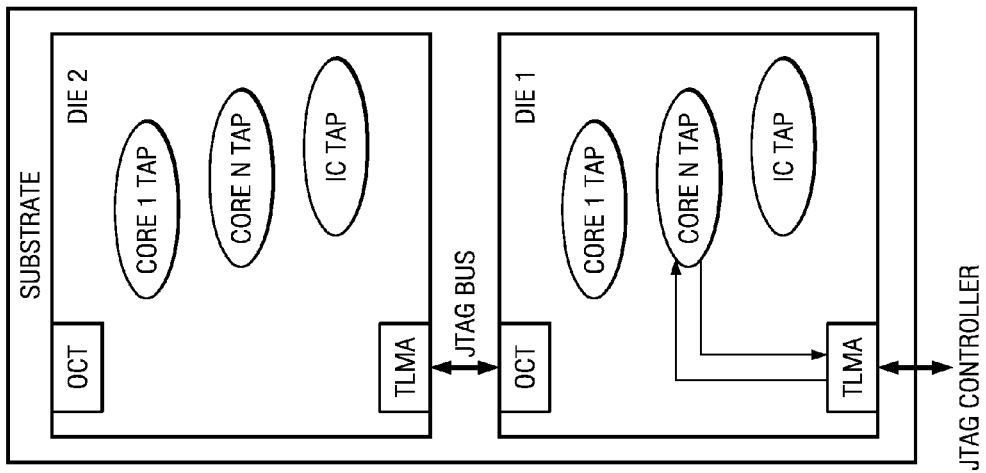
Figure 17C:
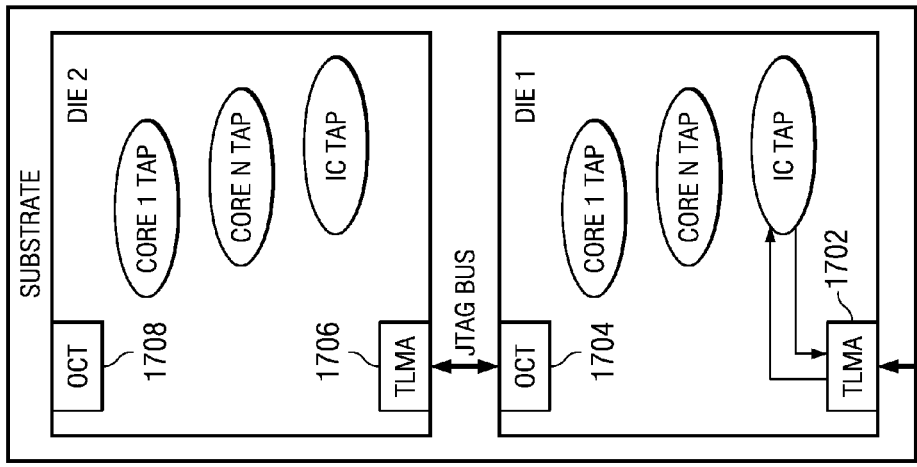
Figure 17D:
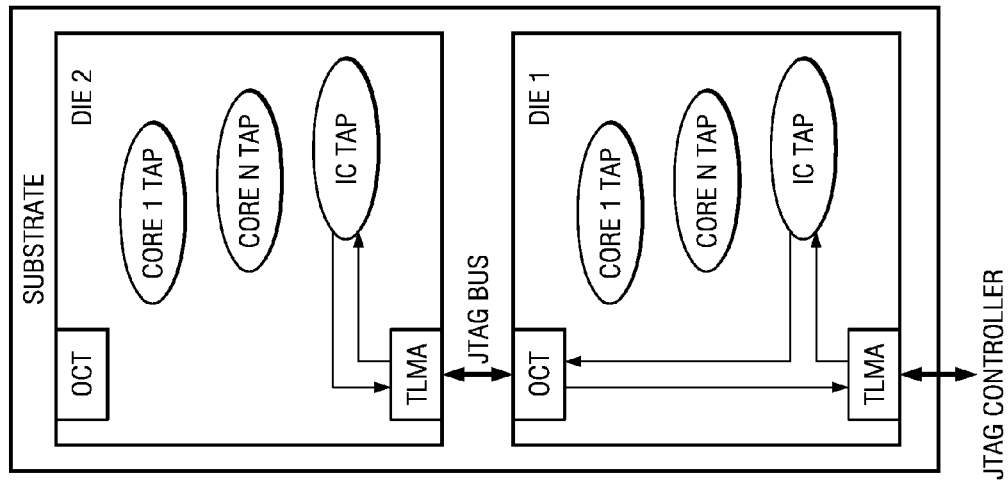
Figure 17E:
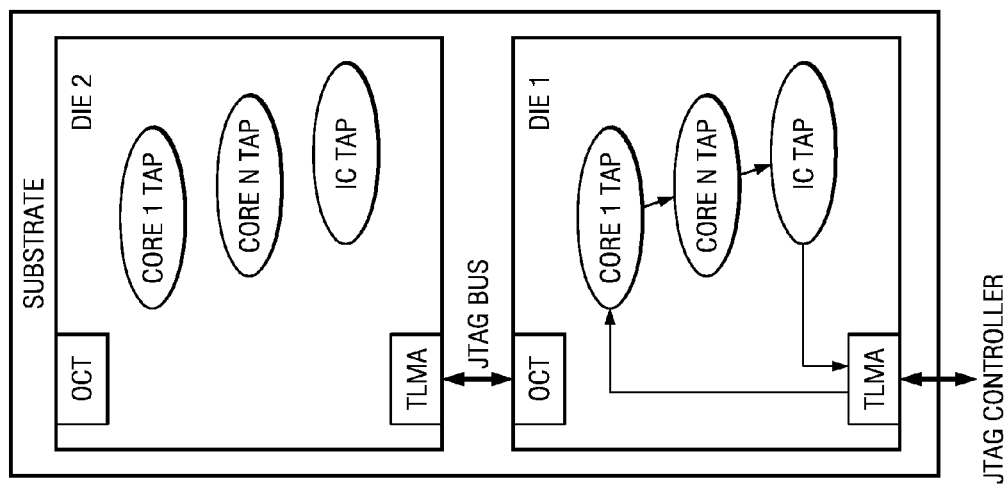
Figure 17F:
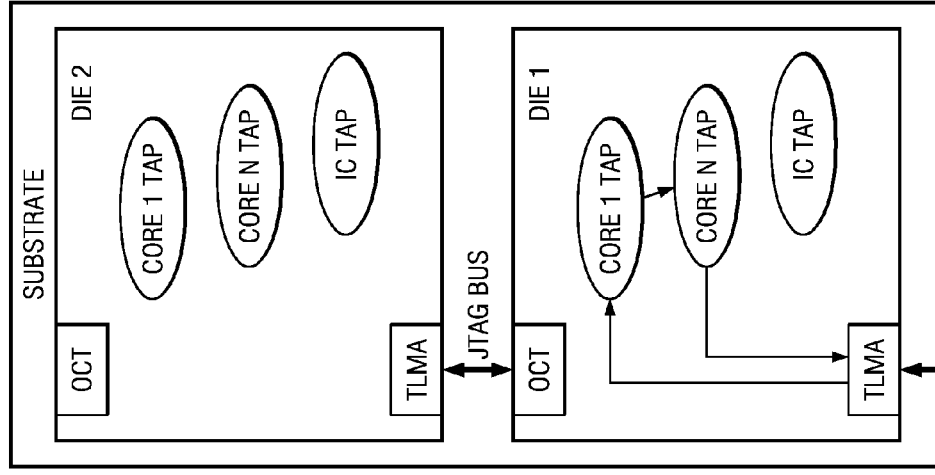
Figure 17G:
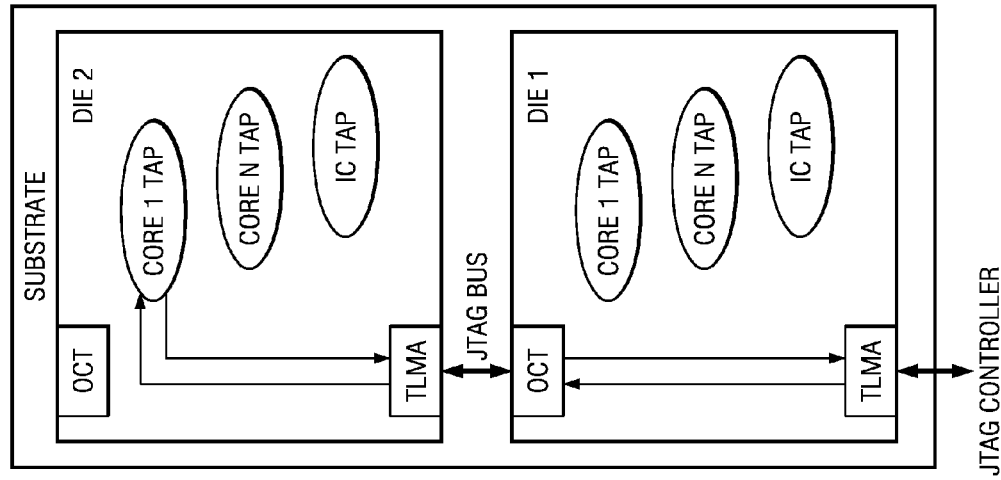
Figure 17H:
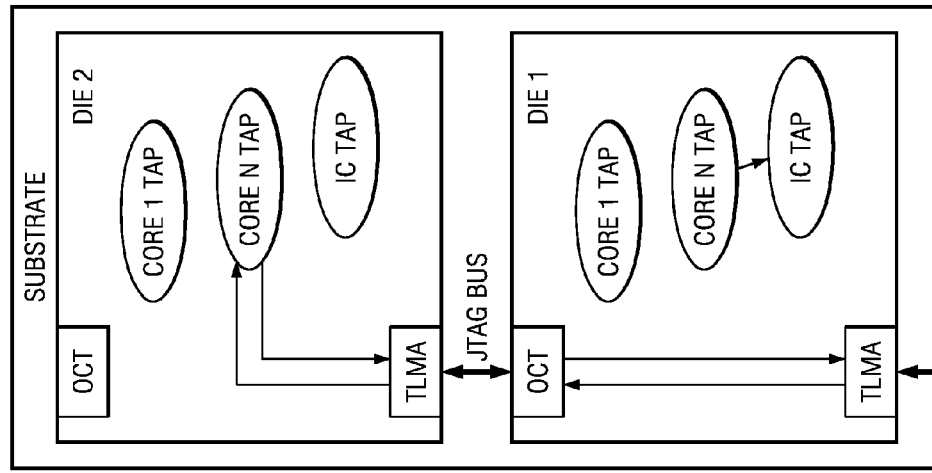

FIGS. 17A-17O show examples of various TAP Link arrangements between two die (Die 1 and 2) located on a common substrate. While each Die 1 and 2 is shown including the improved TLM architecture (TLMA) of FIG. 16 it should be understood that only Die 1 of each example requires the TLM architecture of FIG. 16 to provide access to Die 2. Die 2 of each example could simply have a JTAG architecture as shown in FIG. 1A. In each example, the conventional TAP interface 1702 of Die 1 (TDI, TCK, TMS, TRST, and TDO) is the TLMA interface of Die 1 and is coupled to a JTAG bus controller, such as a tester, debugger, emulator, or other controller. Also in each example, the OCT interface 1704 of Die 1 (TDI, TCK, TMS, TRST and TDI) is coupled to the conventional TAP interface 1706 of Die 2 (TDI, TCK, TMS, TRST and TDI) which is the TLMA interface of Die 2.

In example A, only the IC TAP of Die 1 is included in the link to the JTAG controller. In example B, only the Core N TAP is included in the link to the JTAG controller. In example C, only the Core 1 TAP is included in the link to the JTAG controller. In example D, the Core 1 and Core N TAPs are included in the link to the JTAG controller. In example E, all TAPs of Die 1 are included in the Link to the JTAG controller.

In example F, the IC TAPs of Die 1 and 2 are included in the Link to the JTAG controller, the IC TAP of Die 2 being accessed via the OCT interface of Die 1. The Link of Example F would be selected to allow performing JTAG Extest interconnect testing on both Die 1 and Die 2. As mentioned in regard to option 2 of FIG. 16, the link arrangement of example F may be selected as the powerup/reset link to allow the IC TAPs of both Die 1 and 2 to be accessed for interconnect testing.

In example G, the TAPs of Die 1 are all bypassed while the IC TAP of Die 2 is included in the link to the JTAG controller via the OCT of Die 1. In this arrangement, the TAP link of Die 1 would be as shown in Link13 of FIGS. 15 and 16. Examples H through L similarly bypass the Die 1 TAPs to access the TAPs of Die 2 via the OCT. Example M through O illustrates various links that include TAPs of both Die 1 and Die 2. Examples L and O illustrate that the OCT of Die 2 could be used if necessary to link to TAP interfaces of other Die.

Figure 18:
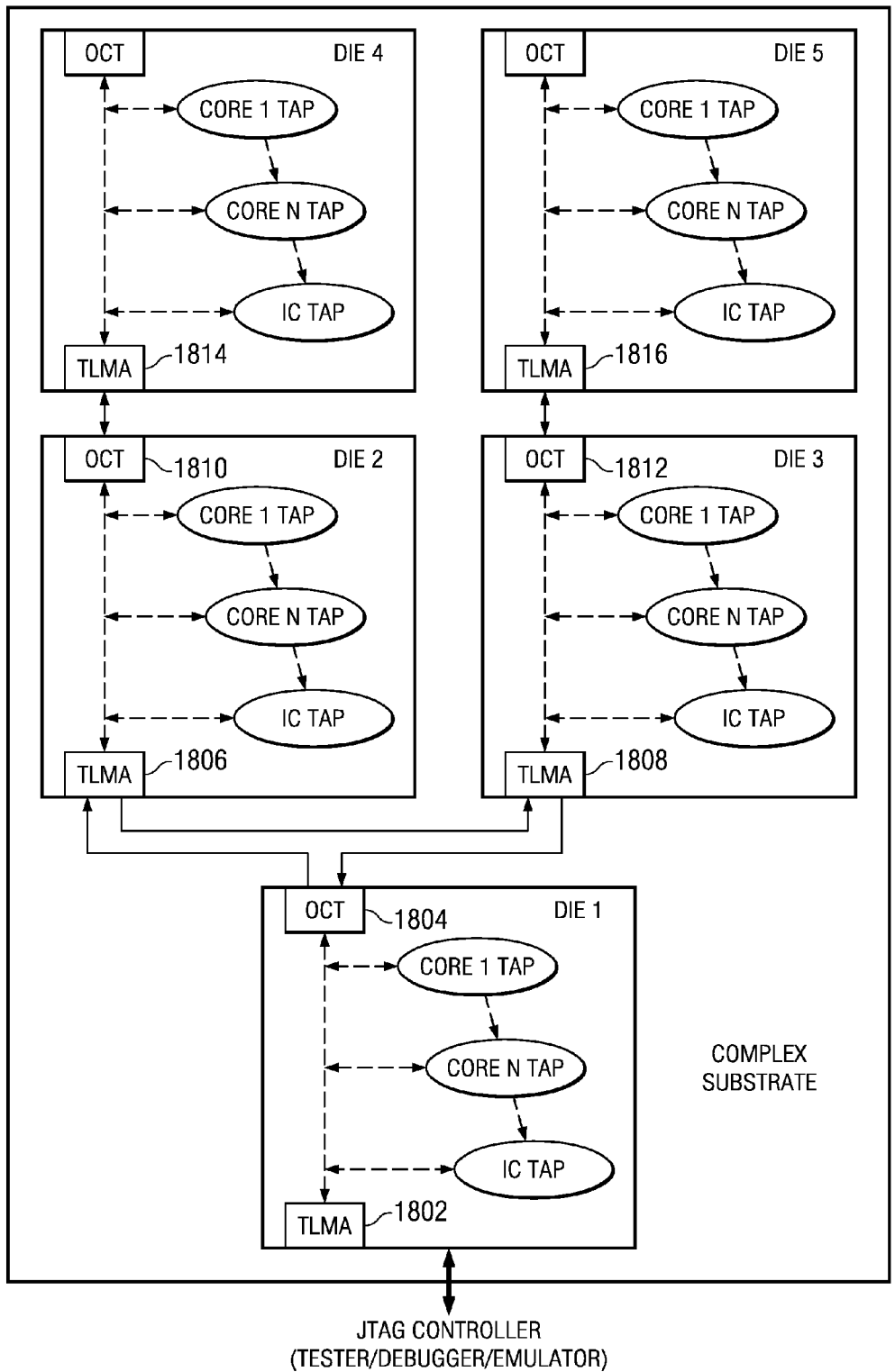
FIG. 18 illustrates a more complex arrangement of Die on substrate, each Die including the improved TLM architecture of FIG. 11A.

FIG. 18 illustrates an example of a more complex Die on Substrate arrangement whereby the flexibility of the improved TLM architecture can be further seen. The TLMA interface 1802 of Die 1 serves as the Die coupled to the JTAG controller, as it did in the previous examples. Die 1 also serves as the TAP access point, via its OCT 1804, to daisy-chained TLMA interfaces 1806 and 1808 of Die 2 and 3. Die 2 and Die 3 serve as further TAP access points, via their OCTs 1810 and 1812, to TLMAs 1814 and 1816 of Die 4 and 5, respectively. By dotted line arrows it is seen that any one or more TAP domains of each Die 1-5 may be selected and linked for access via the JTAG controller connection to Die 1. Further, bypassing of Die 1, as in examples G through L allows direct access to Die 2 and 3. Die 2 and 3 can be similarly bypassed to provide direct access to Die 4 and 5.

Figure 19:
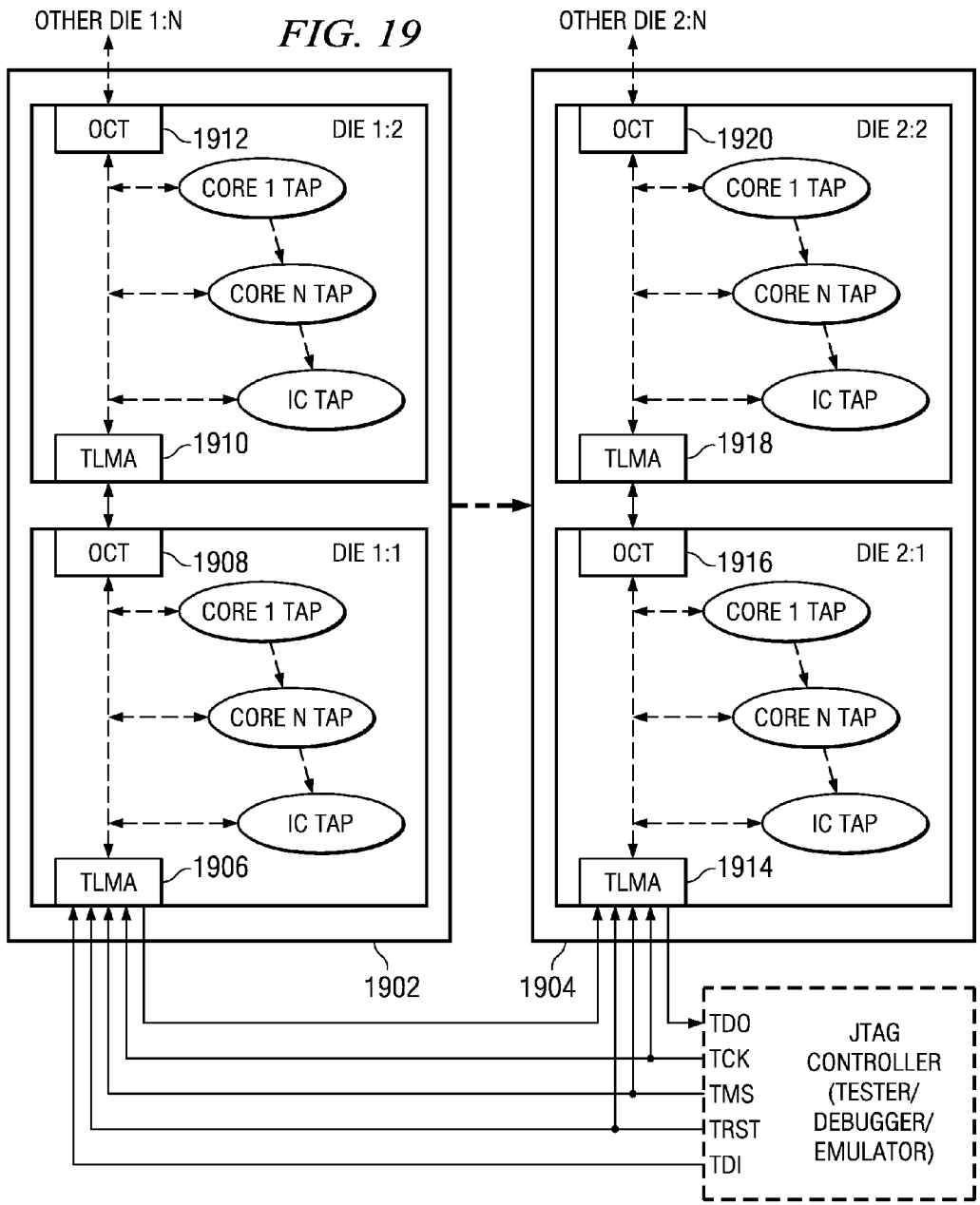
FIG. 19 illustrates two substrates serially daisy-chained to a JTAG controller, each substrate including two Die each implementing the improved TLM architecture of FIG. 11A.

FIG. 19 illustrates two substrates 1902 and 1904 each with two die that include the improved TLM architecture of FIG. 11A. Substrate 1902 includes a die labeled Die 1:1 and a die labeled Die 1:2. Substrate 1904 includes a die labeled Die 2:1 and a die labeled Die 2:2. The TLMA interface 1906 of Die 1:1 is daisy-chained with the TLMA interface 1914 of Die 2:1. The daisy-chained path is coupled to a JTAG controller. The TLMA interface 1910 of Die 1:2 is coupled to the OCT interface 1908 of Die 1:1. The TLMA interface 1918 of Die 2:2 is coupled to the OCT interface 1916 of Die 2:1. The importance of FIG. 19 is the showing of a serial access approach whereby the JTAG controller may access TAP domains vertically as well as horizontally. The Die labeling is done such that the left number indicates the horizontal position of the Die's substrate on the daisy-chained path and the right number indicates the vertical position of the Die on the substrate.

Figure 17I:
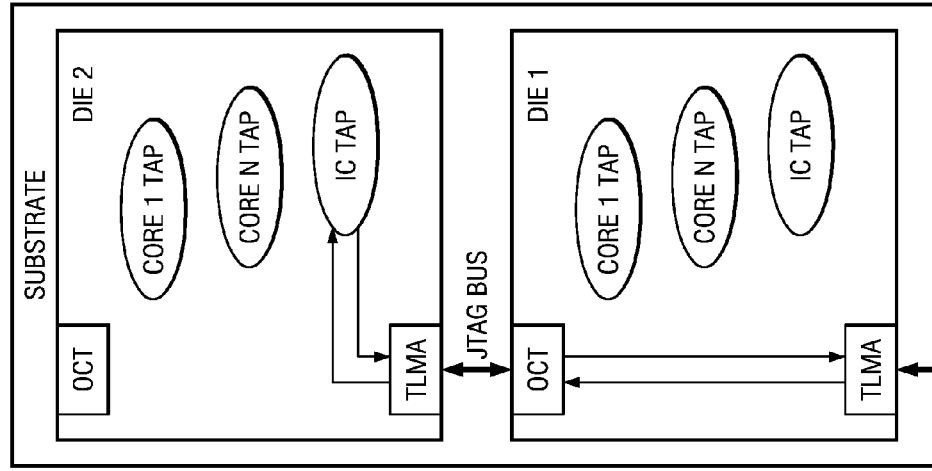
Figure 17J:
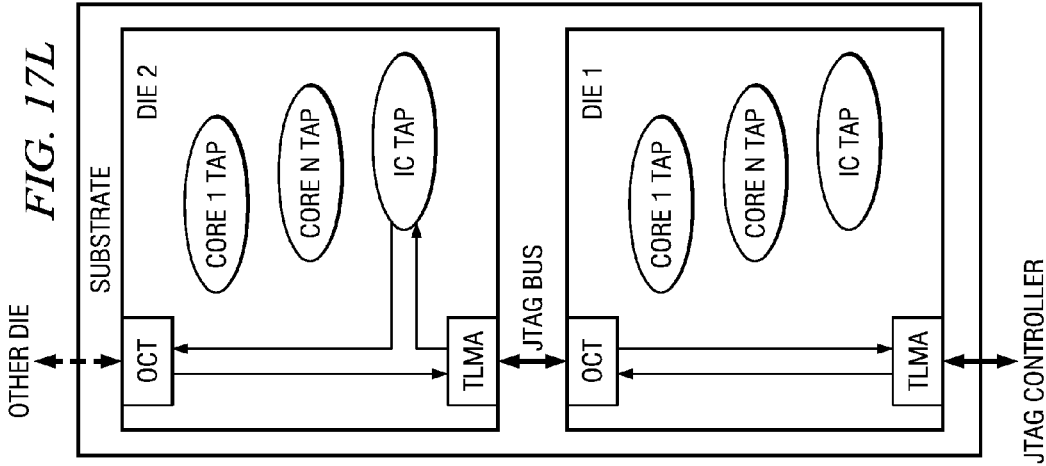
Figure 17K:
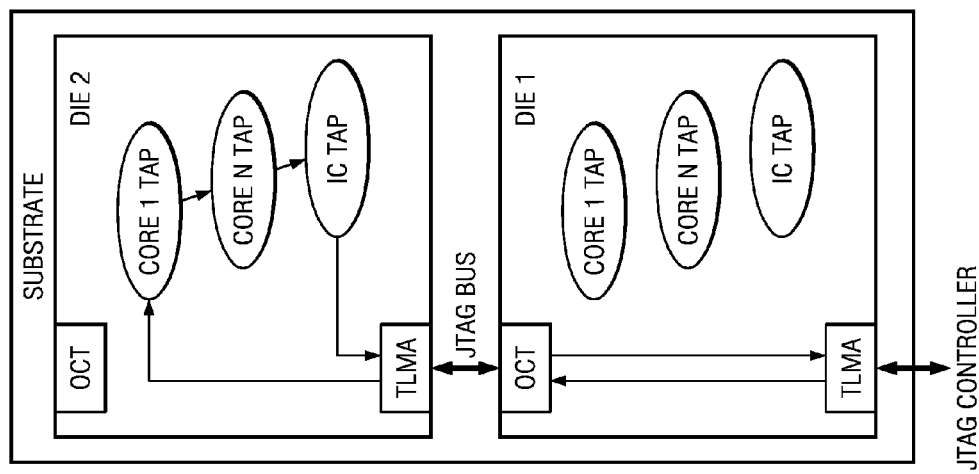
Figure 17L:
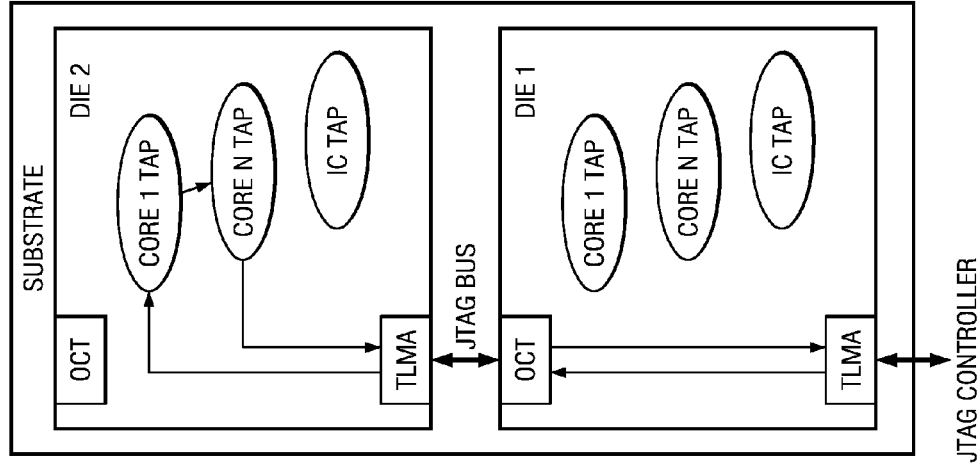

In a first example, the JTAG controller may horizontally access TAP domains of only Die 1:1 and 2:1 in the daisy-chain arrangement without accessing the TAP domain of vertically accessible Die 1:2 and 2:2. In a second example, the JTAG controller may vertically access the TAP domains of Die 1:2, via the OCT of Die 1:1, and include those TAP domains in with the daisy-chained horizontal access of TAP domains in Die 1:1 and 2:1. In a third example, the JTAG controller may vertically access the TAP domains of Die 1:2 via the OCT of Die 1:1, the TAP domains of Die 2:2 via the OCT of Die 2:1, and include those TAP domains in with the daisy-chained horizontal access of TAP domains in Die 1:1 and 2:1. In a forth example, the JTAG controller may bypass (as shown in FIGS. 17J-17I) the TAP domains of Die 1:1 and 2:1 to vertically access the TAP domains of Die 1:2 and 2:2 such that only the TAP domains of Die 1:2 and 2:2 are included in the horizontal daisy-chain path to the JTAG controller. As can be seen, access to additional vertical Die is possible using the OCT interfaces 1912 and 1920 of Die 1:2 and 2:2.

Figure 20:
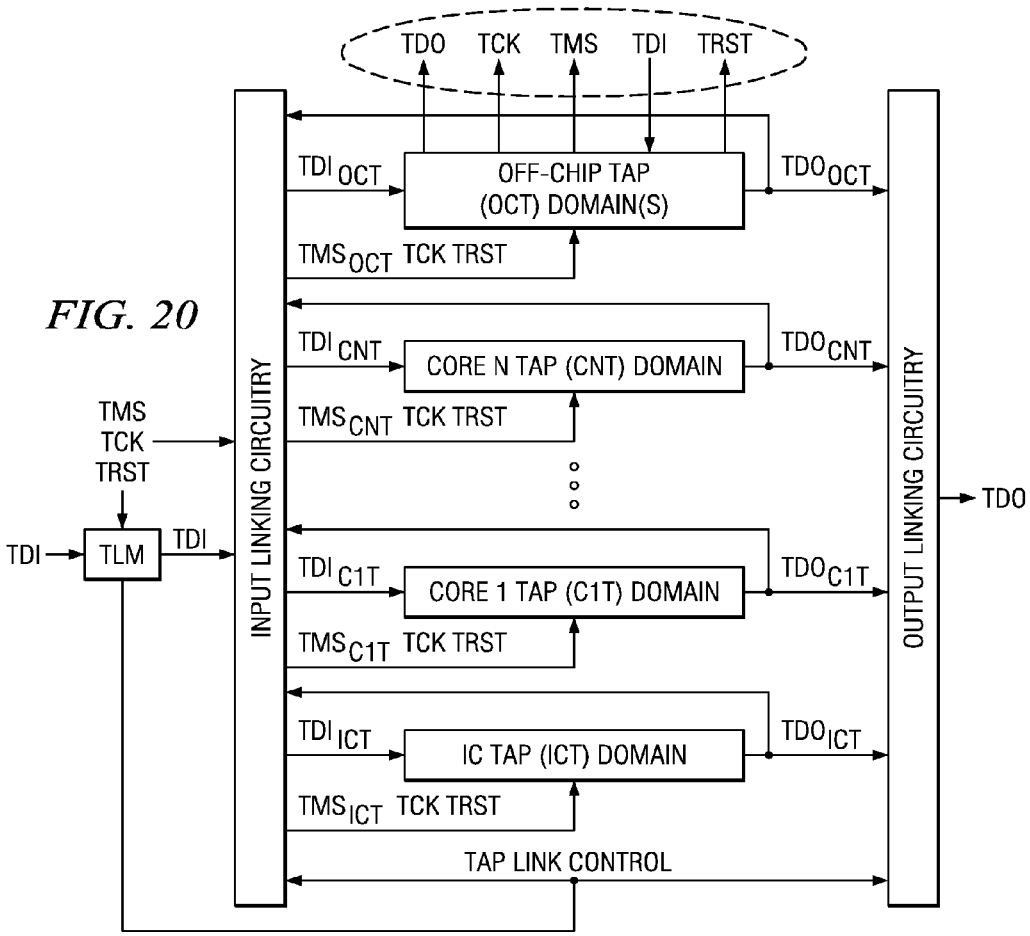
FIG. 20 illustrates the improved TLM architecture whereby the position of the TLM circuit is moved such that it exists on the serial path next to the IC's TDI input pin instead of on the serial path next to the IC's TDO pin as illustrated in FIG. 11A.

FIG. 20 is provided to indicate that the TLM can be positioned at the beginning of the IC's TDI to TDO serial path instead of at the ending as shown in FIG. 11A, if desired. The TLM circuit would operate as previously described to control the input and output linking circuitry. The only difference would be that the TLM's instruction shift register would no longer need to capture the JTAG required 0 and 1 bits shown in FIG. 8B, since those 0 and 1 bits would be provided during instruction scan operations to the IC's TDO by the selected TAP domain(s) instruction register. The leading position of the TLM in FIG. 19 would alter the TAP link arrangement examples of FIGS. 15 and 16 to the extent that the TLM would be shown existing at the beginning of the linked TAP domains (i.e. closes to the TDI pin) instead of at the ending of the linked TAP domains (i.e. closes to the TDO pin).

Figure 21:
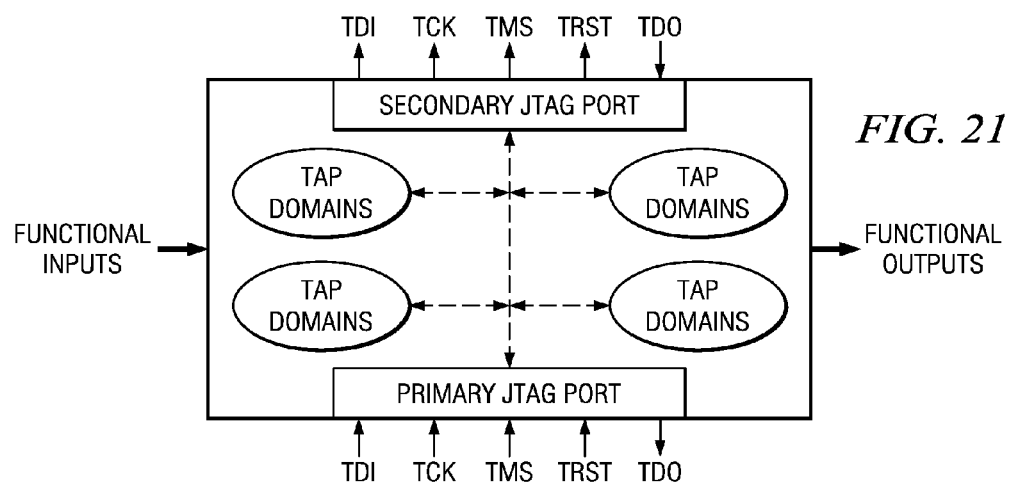
FIG. 21 illustrates a functional IC that includes the conventional JTAG port interface and the OCT interface of the present invention.

FIG. 21 illustrates an IC including the present invention. The IC has functional inputs and outputs and functional circuitry responsive thereto. The IC has a conventional primary JTAG port (i.e. TLMA interface of the present invention) and a secondary JTAG port (i.e. OCT interface of the present invention). While a detail description has been given of how the TLM architecture can be improved to include the secondary JTAG port (OCT) of FIG. 21, there may be alternative/derivative approaches that could be envisioned to couple a primary JTAG port of a functional IC to a secondary port of the same functional IC. These other approaches would be inspired by the teachings provided by the present invention. To the extent that the present invention has provided an original teaching of at least one preferred way of doing this, the invention deserves claims that would broadly cover a functional IC that includes a conventional primary JTAG port for coupling to a JTAG controller and a secondary JTAG port for coupling to another primary JTAG port of another IC.

What is claimed is:

1. An integrated circuit, comprising:
   A. a substrate;
   B. a first die carried on the substrate, the first die including:
      i. a first interface having a TDI input signal lead, a TCK input signal lead, a TMS input signal lead, a TRST input signal lead, and a TDO output signal lead;
      ii. a second interface having a TDI output signal lead, a TCK output signal lead, a TMS output signal lead, a TRST output signal lead, and a TDO input signal lead;
      iii. first test access port circuitry having a TDI input, a TCK input, a TMS input, a TRST input, and a TDO output; and
      iv. first selection circuitry connected to the first interface, the second interface, and the first test access port circuitry, the first selection circuitry selectively connecting the signals on the first interface leads of the first die with the second interface leads of the first die and the inputs and output of the first test access port circuitry; and
   C. a second die carried on the substrate, the second die including:
      i. a third interface having a TDI input signal lead coupled with the TDI output signal lead of the second interface, a TCK input signal lead coupled with the TCK output signal lead of the second interface, a TMS input signal lead coupled with the TMS output signal lead of the second interface, a TRST input signal lead coupled with the TRST output signal lead of the second interface, and a TDO output signal lead coupled with the TDO input signal lead of the second interface;
      ii. second test access port circuitry having a TDI input, a TCK input, a TMS input, a TRST input, and a TDO output; and
      iii. second selection circuitry connected to the third interface and the second test access port circuitry, the second selection circuitry selectively connecting the signals on the third interface leads of the second die with the inputs and output of the second test access port circuitry.

2. The integrated circuit of claim 1 in which the first selection circuitry is linking module circuitry and the second selection circuitry is linking module circuitry.

* * * * *